(12) United States Patent
Liao et al.

(10) Patent No.: US 6,603,150 B2
(45) Date of Patent: Aug. 5, 2003

(54) ORGANIC LIGHT-EMITTING DIODE HAVING AN INTERFACE LAYER BETWEEN THE HOLE-TRANSPORTING LAYER AND THE LIGHT-EMITTING LAYER

(75) Inventors: Liang-Sheng Liao, Rochester, NY (US); Joseph K. Madathil, Rochester, NY (US); Kevin P. Klubek, Webster, NY (US); Ching W. Tang, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/966,618

(22) Filed: Sep. 28, 2001

(65) Prior Publication Data

US 2003/0075720 A1 Apr. 24, 2003

(51) Int. Cl.[7] .................... H01L 33/00; H01L 35/24; H01L 51/40; H01L 21/00
(52) U.S. Cl. .................... 257/98; 257/40; 438/29; 438/99
(58) Field of Search ............. 257/98, 40; 438/29, 438/69, 82, 99

(56) References Cited

U.S. PATENT DOCUMENTS

| | | | |
|---|---|---|---|
| 4,356,429 A | | 10/1982 | Tang |
| 4,359,507 A | | 11/1982 | Gaul et al. |
| 4,769,292 A | | 9/1988 | Tang et al. |
| 4,885,211 A | | 12/1989 | Tang et al. |
| 5,059,862 A | | 10/1991 | VanSlyke et al. |
| 5,061,569 A | | 10/1991 | VanSlyke et al. |
| 5,343,050 A | * | 8/1994 | Egusa et al. ............... 257/103 |
| 5,405,709 A | | 4/1995 | Littman et al. |
| 5,484,922 A | | 1/1996 | Moore et al. |
| 5,554,450 A | | 9/1996 | Shi et al. |
| 5,709,959 A | * | 1/1998 | Adachi et al. .............. 313/504 |
| 5,755,999 A | | 5/1998 | Shi et al. |
| 5,766,779 A | | 6/1998 | Shi et al. |
| 5,908,581 A | | 6/1999 | Chen et al. |
| 6,004,685 A | * | 12/1999 | Antoniadis et al. ......... 313/504 |
| 6,020,078 A | | 2/2000 | Chen et al. |
| 6,023,073 A | * | 2/2000 | Strite .......................... 257/103 |
| 6,198,219 B1 | * | 3/2001 | Arai et al. ................... 313/504 |
| 6,368,732 B1 | * | 4/2002 | Jin et al. ...................... 428/690 |
| 6,392,250 B1 | * | 5/2002 | Aziz et al. ................... 257/144 |
| 6,392,339 B1 | * | 5/2002 | Aziz et al. ................... 313/503 |

FOREIGN PATENT DOCUMENTS

| | | |
|---|---|---|
| WO | WO 98/55561 | 12/1998 |
| WO | WO 00/18851 | 4/2000 |
| WO | WO 00/57676 | 9/2000 |
| WO | WO 00/70655 | 11/2000 |

OTHER PUBLICATIONS

"Organic Electroluminescent Diodes" by C. W. Tang et al., Appl. Phys. Letter 51 (12), Sep. 21, 1987, pp. 913–915.

"Electroluminescence of Doped Organic Thin Films" by C. W. Tang, et al., J. Appl. Phys. 65 (9), May 1, 1989, pp. 3610–3616.

"Degradation Mechanism of Small Molecule–Based Organic Light–Emitting Devices", by H. Aziz, et al., Science, vol. 283, Mar. 19, 1999, pp. 1900–1902.

"Growth of Dark Spots by Interdiffusion Across Organic Layers in Organic Electroluminescent Devices" by M. Fujihira, et al. Appl. Phys. Letter 68 (13), Mar. 25, 1996, pp. 1787–1789.

* cited by examiner

*Primary Examiner*—Erik Kielin
(74) *Attorney, Agent, or Firm*—Raymond L. Owens

(57) ABSTRACT

An organic light-emitting device includes a substrate, an anode, a cathode, disposed between the anode and the cathode is an electroluminescent medium including, in sequence: a hole-transporting layer; an interface layer; a light-emitting layer; and an electron-transporting layer. The interface layer comprises a compound having an ionization potential greater than that of the organic compound of the hole-transporting layer, and an energy bandgap equal to or greater than that of the organic compound of the light-emitting layer. Wherein the thickness of the interface layer is in the range of 0.1 nm~5 nm. The interface layer provides more balanced carrier recombination in the light-emitting layer, and achieves higher luminance efficiency.

4 Claims, 1 Drawing Sheet

ORGANIC LIGHT-EMITTING DIODE HAVING AN INTERFACE LAYER BETWEEN THE HOLE-TRANSPORTING LAYER AND THE LIGHT-EMITTING LAYER

FIELD OF THE INVENTION

The present invention relates to organic light-emitting diode devices and more particularly to improving the luminance efficiency of such a device.

BACKGROUND OF THE INVENTION

Organic light-emitting diodes (OLEDs) are a class of electronic devices that emit light in response to electrical current applied to the devices. The structure of an OLED generally comprises, in sequence, a glass support, a transparent anode, an organic hole-transporting layer (HTL), an organic light-emitting layer (EML), an organic electron-transporting layer (ETL), and a metal cathode. Tang et al, in Applied Physics Letters, 51, 913 (1987), Journal of Applied Physics, 65, 3610 (1989), and commonly assigned U.S. Pat. No. 4,769,292, demonstrated highly efficient OLED using such a layer structure. In order to operate the device with a higher efficiency, a balanced carrier recombination in the light-emitting layer is needed in the device. By balanced carrier recombination, it is meant that the rate of arrival of the number of holes in the emitting layer is preferably equal to the rate of arrival of the number of electrons. In this manner, the probability of holes meeting with electrons in the light-emitting layer is optimized. Recombination of these holes and electrons produces light, also known as electroluminescence. However, OLED devices with multilayer structure as described by Tang et al. in the above references do not necessarily provide the configuration to achieve a balanced carrier recombination. One of the reasons is that the hole carriers have a tendency to be more mobile than the electron carriers, therefore, the number of holes injected into the light-emitting layer is considerably larger than the number of electrons injected into this layer. As a result, the electron-hole recombination events are not optimized and the efficiency of electroluminescence is reduced. Furthermore, it has been shown by Aziz et al. (Science, 283, 1900 [1999]) that injection of excessive holes into the light-emitting layer is undesirable as it could lead to the degradation of the OLED device. Also, a direct contact between the hole-transporting layer and the light-emitting layer could lead to a non-uniform intermixing of materials between these layers, resulting in the formation of non-emissive sites known as dark spots. This observation was reported by Fujihira et al. (Applied Physics Letters, 68, 1787 [1996]).

Various efforts have been made to improve cathode and to improve electron-transporting materials in order to get more efficient light-emission from the OLEDs. For example, Tang et al. (U.S. Pat. No. 4,885,211) and VanSlyke et al. (U.S. Pat. No. 5,059,862) disclosed several kinds of cathodes with reduced electron injection barriers. Shi et al. (U.S. Pat. No. 5,766,779) disclosed new electron-transporting organic materials with higher electron mobility. However, under the normal operational conditions, the electron-mobility in these improved electron-transporting materials are still relatively low in comparison with the hole-mobility of the common hole-transporting materials used in the OLED device. Thus, even if both the anode and the cathode were perfectly injecting charged carriers, meaning that both contacts are ohmic, the large difference in the hole-mobility and the electron-mobility will result in an unbalanced injection of the number of holes and electrons into the light-emitting layer. Consequently, the electroluminescence efficiency is poor.

SUMMARY OF THE INVENTION

It is an object of the present invention to provide an OLED with improved efficiency.

This object is achieved in an organic light-emitting device comprising, in sequence:

a) a substrate;

b) an anode;

c) a hole-transporting layer having a hole-transporting organic compound;

d) an interface layer in a range of thickness between 0.1 nm to 5 nm;

e) a light-emitting layer having a light-emitting organic compound;

f) an electron-transporting layer having an electron-transporting organic compound; and g) a cathode;

wherein the interface layer contains a compound having an ionization potential greater than that of the organic compound of the hole-transporting layer, and an energy bandgap equal to or greater than that of the organic compound of the light-emitting layer.

ADVANTAGES

An advantage of the present invention is that OLED devices with improved luminance efficiency are produced. It has been found quite unexpectedly that the interface layer disposed between the hole-transporting layer and the light-emitting layer in the range of thickness between 0.1 nm and 5 nm can significantly improve the luminance efficiency of the OLED device. This interface layer provides a mechanism wherein the injection of holes and electrons into the light-emitting layer is optimized and therefore a balanced recombination of electrons and holes is achieved.

These drawings are necessarily of a schematic nature, since the individual layers are too thin and the thickness differences of various elements are too great to permit depiction to scale.

DETAILED DESCRIPTION OF THE INVENTION

In order to more fully appreciate the construction and the performance of the organic light-emitting diodes with an interface layer disposed between a hole-transporting layer and a light-emitting layer in this invention, an organic light-emitting diode without the interface layer will be described with reference to FIG. 1. While FIG. 1 serves as an example, there are numerous OLED devices known in the art with alternative layer structures. This invention is applicable to any OLED device containing a hole-transporting layer/light-emitting layer interface.

Figure 1:
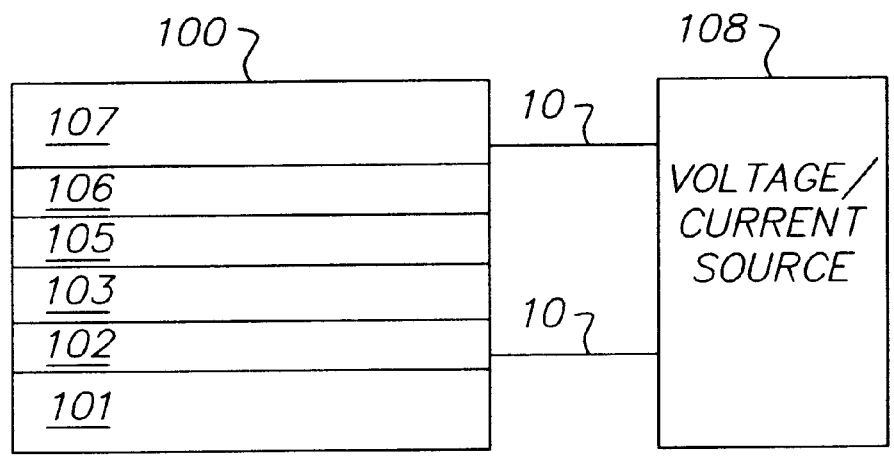
FIG. 1 shows a schematic cross sectional view of an organic light-emitting diode in accordance with the prior art.

In FIG. 1, organic light-emitting diode 100 of the prior art, has a light-transmissive substrate 101 on which is formed a light-transmissive anode 102. The substrate 101 can be glass or quartz, and the anode 102 is preferably a layer of indium-tin-oxide (ITO) formed over the substrate 101. An organic hole-transporting layer 103, an organic light-emitting layer 105, and an organic electron-transporting layer 106 are formed over the anode 102, in sequence. A metal cathode 107 is then formed over the electron-transporting layer 106. The organic layers 103, 105, and 106, as well as the cathode 107, can be formed by a conventional vapor deposition method. In an alternative embodiment, layer 103 can be applied by spin-coating.

The organic light-emitting diode 100 is operated by applying an electric potential, generated by voltage/current source 108, between the anode 102 and the cathode 107, such that anode 102 is at a more positive potential with respect to the cathode 107. Electrical conductors 10 connect anode 102 and cathode 107 to voltage/current source 108. By applying an electric potential, holes (positively charged carriers) are injected from anode 102 into the organic hole-transporting layer 103. Simultaneously, electrons (negatively charged carriers) are injected from cathode 107 into the organic electron-transporting layer 106. The holes and electrons recombine in the organic light-emitting layer 105. This hole-electron recombination results in light-emission from the light-emitting layer 105 and the light is emitted through both the light-transmissive anode 102 and the light-transmissive substrate 101. The color or hue of light emitted from the device 100 can be selected by using a suitable composition of organic materials for the organic light-emitting layer 105. A commonly used composition comprises a dopant-host matrix in which one or more fluorescent or phosphorescent dyes (dopants) are uniformly dispersed in a host material.

Organic materials useful for the hole-transporting layer 103 are generally aromatic amine molecules with a low ionization potential. Some of the hole-transporting materials have been disclosed by Tang et al. (U.S. Pat. No. 4,769,292), VanSlyke et al. (U.S. Pat. Nos. 4,359,507 and 5,061,569), and Shi et al. (U.S. Pat. No. 5,554,450), the disclosures of which are incorporated herein by reference. Polymeric hole-transporting materials are also known, such as poly (vinylcarbazole) and poly(ethylenedioxythiophene). The range of ionization potentials generally found in common hole-transporting materials such as those disclosed in the above cited patents is between 5.0 to 5.5 eV. The term ionization potential (IP) is a measure of the minimum energy required to remove an electron from the molecule or compound. It is also a measure of the energy difference between the highest occupied molecular orbital of the molecule and a reference energy level known as the vacuum energy level.

Another feature of the hole-transporting materials is that they are colorless. This means that the energy bandgap of these materials is usually greater than 3.0 eV. The term energy bandgap ($E_g$) is the difference in the energy between the highest occupied molecular orbital (HOMO) and the lowest unoccupied molecular orbital (LUMO).

Organic materials useful for the light-emitting layer 105 have been disclosed by Tang et al. (U.S. Pat. Nos. 4,356,429 and 4,769,292), Littman et al. (U.S. Pat. No. 5,405,709), Moor et al. (U.S. Pat. No. 5,484,922), Shi et al. (U.S. Pat. No. 5,755,999), and Chen et al. (U.S. Pat. Nos. 5,908,581 and 6,020,078), the disclosures of which are incorporated herein by reference. Phosphorescent compounds, e.g., transition metal complexes as described in WO 98/55561, WO 00/18851, WO 00/57676, and WO 00/70655, are also useful.

A mixture of materials is commonly used for the light-emitting layer in the form of a dopant-host matrix. The dopant is a fluorescent or phosphorescent dye of high quantum efficiency and the host is a material capable of transporting both electrons and holes. The dopant is generally present in a small quantity on the order of a few percent or less and is uniformly dispersed in the host matrix. Depending on the emission spectrum of the dopant, electroluminescence of various colors is produced. The energy bandgap of the dopant is necessarily smaller than that of the host to facilitate the energy transfer from the host to the emissive dopant molecules. In a preferred embodiment, this invention can be used in OLED devices that emit red, green, or blue light, and all combinations thereof, including white light.

Organic materials useful for the electron-transporting layer 106 have been disclosed by Tang et al. (U.S. Pat. Nos. 4,356,429 and 4,769,292), VanSlyke et al. (U.S. Pat. No. 4,359,507), and Shi et al. (U.S. Pat. No. 5,766,779), the disclosures of which are incorporated herein by reference. A main feature of the electron-transporting materials is that they have relatively high electron mobility to facilitate the transmission of electrons from cathode to the light-emitting layer. It is often the case that the host materials used in the light-emitting layer can also be used in the electron-transporting layer.

Figure 2:
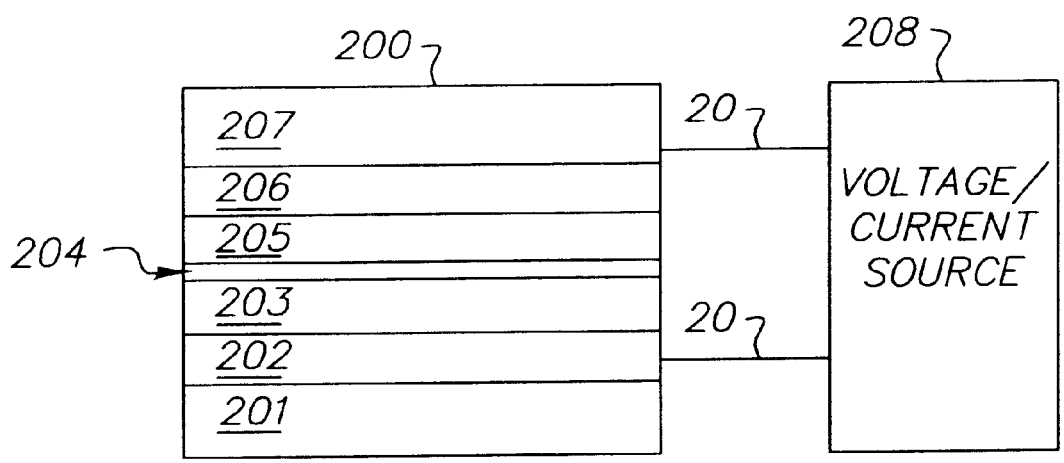
FIG. 2 is a schematic cross sectional view of an organic light-emitting diode in accordance with the present invention, and having an interface layer disposed between the hole-transporting layer and the light-emitting layer.

Turning to FIG. 2, the organic light-emitting diode 200 of the invention has an interface layer 204. Layer 204 is formed over an organic hole-transporting layer 203. A light-emitting layer 205 is formed over the interface layer 204 and an electron-transporting layer 206 is formed over the light-emitting layer 205. The organic light-emitting diode 200 is otherwise constructed and operated in a fashion similar to prior art diode 100. Voltage/current source 208 generates an electric potential between the light-transmissive anode 202 and the cathode 207, such that anode 202 is at a more positive potential with respect to the cathode 207. Electrical conductors 20 connect the anode 202 and the cathode 207 to the voltage/current source 108. Layer 201 is the light-transmitting substrate, over which the anode is formed. Materials useful for layers 203, 205, and 206 are identical to those used in layers 103, 105, and 106 of light-emitting diode 100 of FIG. 1.

It is recognized that in a conventional organic light-emitting diode without the interface layer, such as device 100, the ability of transporting electrons through the electron-transporting layer is often limited by the relatively low electron mobility. In comparison, the hole-transporting layer is often capable of transporting holes with substantially higher mobility. As a result, there are typically more holes than electrons arriving at the light-emitting layer when electric current is passed through the OLED. Under this condition, not all charge carriers are utilized in the generation of light through recombination of electrons and holes, portion of these charge carriers are lost by transiting through the light-emitting diodes without recombination. The excess carriers are mostly holes because of the imbalance of the hole and electron mobility.

In the present invention, the interface layer 204 disposed between the hole-transporting layer 203 and the light-emitting layer 205 provides a way of attenuating the arrival of holes into the light-emitting layer. In this manner, the arrival of holes and electrons into the light-emitting layer can be made to be equal or approximately equal, thus improving the probability of recombination of holes and electrons. Excess hole carriers are minimized and the electroluminescence efficiency is improved as a result.

In order to attenuate the arrival of holes into the light-emitting layer, the electronic properties of interface layer 204 are such that a potential barrier is created between the hole-transporting layer and the interface layer. Because of such a barrier, the arrival of holes into the interface layer is reduced and consequently the arrival of holes into the light-emitting layer is also reduced. This means that interface layer materials should have an ionization potential greater than that of the hole-transporting layer materials. The potential barrier for hole injection from the hole-transporting layer into the interface layer is the energy difference between the ionization potentials of these two layers. As long as there is a potential barrier, the arrival of holes will be attenuated and the electroluminescence efficiency would be improved. Preferably, the potential barrier between the hole-transporting layer and the interface layer is 0.3 eV or higher, and more preferably, it is greater than 0.5 eV.

Useful interface layer materials can be insulators, semiconductors, or any materials that when used in conjunction with a hole-transporting layer are capable of attenuating the transmission of holes from the hole-transporting layer to the interface layer. Since most hole-transporting materials useful in organic light-emitting diodes are materials with an ionization potential on the order of 5.0 to 5.5 eV, the interface layer materials can be selected from any materials with an ionization potential relatively higher than that of the hole-transporting material. Thus, the ionization potential of the interface layer is usually greater than 5.0 eV.

The energy bandgap of the interface layer materials is necessarily greater than the energy bandgap of the light-emitting layer materials. In the case of the light-emitting layer containing host and dopant composition, the energy bandgap of the interface layer material should be greater than that of the host material. This condition ensures that the light emission will only come from the light-emitting layer and that the interface layer will not quench the light emission originated from the light-emitting layer. In general, the energy bandgap of the interface layer will be 3.0 eV or greater.

Organic materials useful for the interface layer include hydrocarbons, polynuclear hydrocarbons with fused aromatic rings, aromatic ring compounds with heteroatoms such as nitrogen, oxygen, and sulfur, aromatic amines, tertiary amines, poly-phenyls, and any materials satisfying the requirements of ionization potentials and energy bandgap with good film-forming properties. Preferred materials include:

anthracene and its derivatives;

terphenyl and its derivatives;

quaterphenyl and its derivatives;

hexaphenylbenzene and its derivatives;

phenyloxazole and its derivatives spirobifluorene and its derivatives

[2,2'-p-phenylenebis(4-methyl-5-phenyloxazole)] (dimethylPOPOP);

2,2',7,7'-tetra-2-naphthyl-9,9'-spirobifluorene (NSBF); and 2,2',7,7'-tetracarbazol-9-yl-9,9'-spirobifluorene (CSBF).

Inorganic materials useful for the interface layer includes $SiO_2$, $Si_3N_4$, and other metal oxide and metal nitride, as long as the materials satisfy the requirements of ionization potentials and energy bandgap.

The range of thickness found to be useful for the construction of the interface layer is between 0.1 and 5 nm and, more preferably, 0.5 to 5 nm. In fact, a single monolayer of the interface layer material disposed between the hole-transporting layer and the light-emitting layer can be sufficient to provide the desired attenuation of hole injection from the hole-transporting layer. The range of thickness indicated is to ensure that there is no direct contact between the hole-transporting layer and the light-emitting layer. Increasing the thickness of the interface layer beyond 5 nm may have an adverse effect on the organic light-emitting device performance, as the holes may be increasingly blocked from reaching the light-emitting layer, causing an increase in the drive voltage. Many thin-film deposition methods are known in the art and are applicable to this invention (vapor deposition, spin-apply, inkjet apply, lamination, etc.), however, the preferred method is vapor deposition.

EXAMPLES

The following examples are presented for a further understanding of the present invention. For purposes of brevity, the materials and layers formed therefrom will be abbreviated as given below.

ITO: indium-tin-oxide; used in forming transparent anode 102, 202

NPB: 4,4'-bis-(1-naphthyl-N-phenylamino)-bi-phenyl; used in forming the hole-transporting layer 103, 203

Alq: tris(8-hydroxyquinoline)aluminum(III); used in forming the light-emitting layer 105, 205, and most of time also in forming the electron-transporting layer 106, 206

TBADN: 2-(1,1-dimethyethyl)-9,10-bis(2-naphthalenyl) anthracene; used in forming the light-emitting layer 105, 205 (with blue dopant)

TBP: 2,5,8,11-tetra-t-butylperylene; a blue dopant in the light-emitting layer 105, 205

C545T: 10-(2-benzothiazolyl)-1,1,7,7-tetramethyl-2,3,6,7-tetrahydro-1H,5H, 11H(1)benzopyrano(6,7,8-ij) quinolizin-11-one; a green dopant in the light-emitting layer 105, 205

DCJTB: 4-(dicyanomethylene)-2-t-butyl-6-(1,1,7,7-tetramethyljulolidyl-9-enyl)-4H-pyran; a red dopant in the light-emitting layer 105, 205

MgAg: magnesium:silver at a ratio of 10:1 by volume; used in forming the cathode 107, 207

DimethylPOPOP: 2,2'-p-phenylenebis(4-methyl-5-phenyloxazole)

NSBF: 2,2',7,7'-tetra-2-naphthyl-9,9'-spirobifluorene

CSBF: 2,2',7,7'-tetracarbazol-9-yl-9,9'-spirobifluorene

Comparative Example 1

The preparation of the prior art OLED device (see FIG. 1) is as follows: A glass substrate coated with a transparent ITO conductive layer was cleaned and dried using a commercial glass scrubber tool. The ITO surface was subsequently treated with oxidative plasma to condition the surface as an anode. The following layers were deposited in the following sequence by sublimation from a heated crucible boat in a conventional vacuum deposition chamber under a vacuum of approximately $10^{-6}$ Torr:

(1) a hole-transporting layer, 75 nm thick, consisting of NPB and having an IP of 5.2 eV;

(2) a light-emitting layer, 35 nm thick, consisting of Alq and having an energy bandgap of 2.7 eV;

(3) an electron-transporting layer, 25 nm thick, also consisting of Alq; and (4) a cathode, approximately 220 nm thick, consisting of MgAg.

This device structure is otherwise an optimized structure in achieving relatively high luminance efficiency in prior art devices.

The EL characteristics of this device were evaluated using a constant current source and a photometer. The efficiency, the driving voltage, the EL peak, and the CIE coordinates (a standard measure of color hue) were measured at a current density of 20 mA/cm². Their values are shown in Table I.

Examples 2–7

OLED devices similar to that of Comparative Example 1 were prepared, except that an interface layer was deposited on the top of hole-transporting layer before the deposition of the light-emitting layer (see FIG. 2). Example 2 utilized a 1 nm thick interface layer of anthracene (IP=7.4 eV, $E_g$=3.3 eV ). Example 3 utilized a 2 nm thick interface layer of p-terphenyl (IP=7.8 eV, $E_g$=3.9 eV). Example 4 utilized a 2 nm thick interface layer of p-quaterphenyl (IP>6.5 eV, $E_g$=3.7 eV). Example 5 utilized a 2 nm thick interface layer of dimethyl POPOP (IP>5.5 eV, $E_g$>3.3 eV). Example 6 utilized a 2 nm thick interface layer of NSBF (IP>6.0 eV, $E_g$>3.5 eV). Example 7 utilized a 2 nm thick interface layer of CSBF (IP>6.0 eV, $E_g$>3.5 eV). Their EL characteristics of the devices are also shown in Table I along with Comparative Example 1.

TABLE I

Organic layer structure and EL properties of the OLED devices of Example 1–7 (at 20 mA/cm²)

| Example No. | Organic Layer Structure* | Efficiency (cd/A) | Driving Voltage (V) | EL Peak (nm) | $CIE_x$ | $CIE_y$ | Note |
|---|---|---|---|---|---|---|---|
| 1 | NPB(75)/Alq(35)/Alq(25) | 2.97 | 6.40 | 536 | 0.350 | 0.557 | Reference |
| 2 | NPB(75)/anthracene (1)/Alq(35)/Alq(25) | 3.44 | 6.57 | 532 | 0.333 | 0.567 | Invention |
| 3 | NPB(75)/p-terphenyl (2)/Alq(35)/Alq(25) | 3.38 | 6.75 | 536 | 0.358 | 0.555 | Invention |
| 4 | NPB(75)/p-quaterphenyl(2)/Alq(35)/Alq(25) | 3.69 | 6.54 | 528 | 0.346 | 0.557 | Invention |
| 5 | NPB(75)/dimethyl POPOP(2)/Alq(35)/Alq(25) | 3.96 | 6.29 | 536 | 0.354 | 0.553 | Invention |
| 6 | NPB(75)/NSBF(2)/Alq(35)/Alq(25) | 3.68 | 5.9 | 532 | 0.329 | 0.538 | Invention |
| 7 | NPB(75)/CSBF(2)/Alq(35)/Alq(25) | 3.35 | 6.0 | 532 | 0.340 | 0.558 | Invention |

*In sequence of deposition. Numbers in parentheses refer to layer thickness in nm Comparative Example 1 shows that the prior art OLED device, with otherwise the optimized layer structure and with green emission, has a luminance efficiency below 3 cd/A. Quite unexpectedly, Examples 2–7 show that the OLED devices, with an interface layer inserted between the hole-transporting layer and the light-emitting layer, have significantly higher luminance efficiency, well above 3 cd/A for all examples and as high as 3.96 cd/A for Example 5. Their color hue is substantially the same and the driving voltage is even lower for Examples 6 and 7. These materials used in the interface layers satisfy the requirements of IP and Eg as mentioned above.

In order to see the same improvement of the luminance efficiency by inserting the interface layer in the OLED devices with different fluorescent dopant (i.e. with different color emission), more examples are given as following:

Comparative Example 8

A prior art OLED device (see FIG. 1) similar to that of Comparative Example 1 was prepared, except that the light-emitting layer was 37.5 nm thick Alq with 1 vol. % of green emissive dopant, C545T, and that the thickness of the electron-transporting layer increased to 37.5 nm. This is also otherwise an optimized structure for fabricating highly luminescent device with a fluorescent dopant. The EL characteristics of this prior art device are shown in Table II.

Examples 9–11

OLED devices similar to that of Comparative Example 8 were prepared, except that a 2 nm thick interface layer was deposited on the top of the hole-transporting layer before the deposition of the light-emitting layer (see FIG. 2): dimethyl POPOP for Example 9, NSBF for Example 10, and CSBF for Example 11. Their EL characteristics of the devices are also shown in Table II.

Comparative Example 12

A prior art OLED device similar to that of Comparative Examples 1 were prepared, except that the light-emitting layer was 30 nm thick Alq with 1 vol. % of red emissive dopant, DCJTB, and that the thickness of the electron-transporting layer was 45 nm. The EL characteristics of this prior art device are also shown in Table II.

Example 13

OLED device similar to that of Comparative Example 12 was prepared, except that a 2 nm thick CSBF interface layer was deposited on the top of hole-transporting layer before the deposition of the light-emitting layer. The EL characteristics of this device are also shown in Table II.

Comparative Example 14

A prior art OLED device similar to that of Comparative Examples 1 was prepared, except that the light-emitting layer was 20 nm thick TBADN with 1 vol. % of blue emissive dopant, TBP, and that the thickness of the electron-transporting layer was 55 nm. The EL characteristics of this prior art device are also shown in Table II.

Example 15

OLED device similar to that of Comparative Example 14 was prepared, except that a 2 nm thick CSBF interface layer was deposited on the top of hole-transporting layer before the deposition of the light-emitting layer. The EL characteristics of this device are also shown in Table II.

TABLE II

Organic layer structure and EL properties of the OLED devices of Example 8~15 (at 20 mA/cm$^2$)

| Example No. | Organic Layer Structure* | Efficiency (cd/A) | Driving Voltage (V) | EL Peak (nm) | $CIE_x$ | $CIE_y$ | Note |
|---|---|---|---|---|---|---|---|
| 8 | NPB(75)/99:1, Alq:C545T(37.5)/ Alq(37.5) | 10.5 | 7.67 | 524 | 0.322 | 0.632 | Reference |
| 9 | NPB(75)/dimethyl POPOP(2)/99:1, Alq:C545T(37.5)/ Alq(37.5) | 13.56 | 7.64 | 524 | 0.337 | 0.625 | Invention |
| 10 | NPB(75)/NSBF(2)/ 99:1, Alq:C545T(37.5)/ Alq(37.5) | 11.91 | 7.33 | 524 | 0.321 | 0.631 | Invention |
| 11 | NPB(75)/CSBF(2)/ 99:1, Alq:C545T(37.5)/ Alq(37.5) | 12.97 | 7.53 | 524 | 0.325 | 0.630 | Invention |
| 12 | NPB(75)/99:1, Alq:DCJTB (30)/ Alq(45) | 3.56 | 9.02 | 620 | 0.624 | 0.372 | Reference |
| 13 | NPB(75)/CSBF(2)/ 99:1, Alq:DCJTB (30)/Alq(45) | 3.89 | 8.93 | 620 | 0.622 | 0.373 | Invention |
| 14 | NPB(75)/99:1, TBADN:TBP(20)/ Alq(55) | 2.67 | 7.53 | 464 | 0.189 | 0.312 | Reference |
| 15 | NPB(75)/CSBF(2)/ 99:1, TBADN:TBP(20)/ Alq(55) | 3.05 | 7.30 | 464 | 0.217 | 0.340 | Invention |

*In sequence of deposition. Numbers in parentheses refer to layer thickness in nm From Comparative Example 8 to Example 15, it is clear that the OLED devices, with an interface layer disposed between a hole-transporting layer and a light-emitting layer, have higher luminance efficiencies than those of their corresponding comparative devices without any interface layer. At the same time, the insertion of the interface layer does not change the other EL characteristics in the OLED devices.

The invention has been described in detail with particular reference to certain preferred embodiments thereof, but it will be understood that variations and modifications can be effected within the spirit and scope of the invention.

PARTS LIST

10 electrical conductors
20 electrical conductors
100 organic light-emitting diode (PRIOR ART)
101 light-transmissive substrate
102 light-transmissive anode
103 organic hole-transporting layer
105 organic light-emitting layer
106 organic electron-transporting layer
107 metal cathode
108 voltage/current source
200 organic light-emitting diode with interface layer
201 light-transmissive substrate
202 light-transmissive anode
203 organic hole-transporting layer
204 organic thin interface layer
205 organic light-emitting layer
206 organic electron-transporting layer
207 cathode
208 voltage/current source

What is claimed is:

1. An organic light-emitting device comprising, in sequence:

a) a substrate;
   b) an anode;
   c) a hole-transporting layer having a hole-transporting organic compound;
   d) a single interface layer disposed on the hole-transporting layer in a range of thickness between 0.1 nm to 5 nm, and wherein the potential barrier between the hole-transporting layer and the interface layer is greater than 0.6 eV and the energy bandgap of the interface layer is 3.0 eV or greater;
   e) a light-emitting layer disposed on the interface layer having a light-emitting organic compound;
   f) an electron-transporting layer having an electron-transporting organic compound; and
   g) a cathode;

wherein the interface layer contains a compound having an ionization potential greater than that of the organic compound of the hole-transporting layer, and an energy bandgap equal to or greater than that of the organic compound of the light-emitting layer.

2. The organic light-emitting device as in claim 1 wherein the light-emitting layer emits blue, green, red, or white light.

3. The organic light-emitting device as in claim 1 wherein the thickness of the interface layer is in the range of 0.5–5 nm.

4. The organic light-emitting device as in claim 1 wherein the ionization potential of the interface layer is greater than 5.0 eV.

* * * * *